United States Patent
Wang et al.

(10) Patent No.: US 11,605,725 B2
(45) Date of Patent: Mar. 14, 2023

(54) INSULATED GATE BIPOLAR TRANSISTOR AND FABRICATION METHOD THEREFOR

(71) Applicant: ADVANCED SEMICONDUCTOR MANUFACTURING CORPORATION., LTD., Shanghai (CN)

(72) Inventors: Xueliang Wang, Shanghai (CN); Jianhua Liu, Shanghai (CN); Jinrong Lang, Shanghai (CN); Yaneng Min, Shanghai (CN)

(73) Assignee: ADVANCED SEMICONDUCTOR MANUFACTURING CORPORATION., LTD., Shanghai (CN)

( * ) Notice: Subject to any disclaimer, the term of this patent is extended or adjusted under 35 U.S.C. 154(b) by 68 days.

(21) Appl. No.: 17/055,787

(22) PCT Filed: May 17, 2019

(86) PCT No.: PCT/CN2019/087352
§ 371 (c)(1),
(2) Date: Nov. 16, 2020

(87) PCT Pub. No.: WO2019/219071
PCT Pub. Date: Nov. 21, 2019

(65) Prior Publication Data
US 2021/0234019 A1 Jul. 29, 2021

(30) Foreign Application Priority Data
May 17, 2018 (CN) .......................... 201810475934.9

(51) Int. Cl.
*H01L 29/66* (2006.01)
*H01L 29/739* (2006.01)

(52) U.S. Cl.
CPC .... *H01L 29/66325* (2013.01); *H01L 29/7393* (2013.01)

(58) Field of Classification Search
CPC ..... H01L 27/0664; H01L 27/04; H01L 27/06; H01L 27/088; H01L 29/0638;
(Continued)

(56) References Cited

U.S. PATENT DOCUMENTS 6,084,284 A * 7/2000 Adamic, Jr. ............ H01L 24/48
257/E29.198
6,614,087 B1 * 9/2003 Morishita ............... H01L 29/36
257/470
(Continued)

FOREIGN PATENT DOCUMENTS

CN 105185826 A 12/2015
CN 105742346 A 7/2016
(Continued)

OTHER PUBLICATIONS

International Search Report and Written Opinion from PCT Application No. PCT/CN2019/087352 dated Aug. 19, 2019.

*Primary Examiner* — Natalia A Gondarenko
(74) *Attorney, Agent, or Firm* — Harness, Dickey & Pierce, P.L.C.

(57) ABSTRACT

An insulated gate bipolar transistor and a fabrication method therefor, wherein the fabrication method for the insulated gate bipolar transistor comprises the following steps: implanting hydrogen ions, arsenic ions, or nitrogen ions into a substrate from a back surface of the insulated gate bipolar transistor so as to form an n-type heavily doped layer (202) of a reverse conduction diode, the reverse conduction diode being a reverse conduction diode built into the insulated gate bipolar transistor. The described fabrication method and the obtained insulated gate bipolar transistor from a recombination center in an n+ junction of the reverse conduction
(Continued)

diode, thereby accelerating the reverse recovery speed of the built-in reverse conduction diode, shortening the reverse recovery time thereof, and improving the performance of the insulated gate bipolar transistor.

18 Claims, 4 Drawing Sheets

(58) Field of Classification Search
CPC . H01L 29/1095; H01L 29/167; H01L 29/739; H01L 29/7397; H01L 29/0834; H01L 29/8613; H01L 29/407; H01L 29/32; H01L 29/66136; H01L 21/26506; H01L 21/221; H01L 21/26513; H01L 21/266; H01L 21/324; H01L 21/2253; H01L 21/8234; H01L 21/425; H01L 21/426; H01L 21/8222; H01L 21/3215; H01L 21/322; H01L 21/3223; H01L 27/0716; H01L 27/0755; H01L 27/0761; H01L 29/42356; H01L 29/7416; H01L 29/66325; H01L 29/7393; H01L 29/42376; H01L 29/66348; H01L 29/7395; H01L 29/7396; H01L 29/66333; H01L 29/0615; H01L 29/7302; H01L 29/41708; H01L 29/41716; H01L 29/4236; H01L 29/6663; H01L 29/861; H01L 29/7347
USPC ............... 257/139, 140, 329, 655, E21.334, 257/E29.198; 438/529, 530
See application file for complete search history.

(56) References Cited

U.S. PATENT DOCUMENTS

| | | | |
|---|---|---|---|
| 2002/0022352 A1* | 2/2002 | Ozeki | ............... H01L 27/0629 257/E21.418 |
| 2010/0140658 A1* | 6/2010 | Koyama | ........... H01L 29/66325 257/E21.705 |
| 2011/0147880 A1* | 6/2011 | Matthias | ............. H01L 29/8611 257/E21.04 |
| 2015/0311279 A1* | 10/2015 | Onozawa | ........ H01L 29/66333 438/530 |
| 2020/0194562 A1* | 6/2020 | Yoshimura | ........ H01L 29/66348 |

FOREIGN PATENT DOCUMENTS

| | | |
|---|---|---|
| CN | 106558557 A | 4/2017 |
| CN | 110504167 A | 11/2019 |
| JP | 2014175517 A | 9/2014 |

* cited by examiner

INSULATED GATE BIPOLAR TRANSISTOR AND FABRICATION METHOD THEREFOR

CROSS-REFERENCE TO RELATED APPLICATIONS

This application claims priority of Chinese patent application CN201810475934.9, filed on May 17, 2018, the contents of which are incorporated herein by reference in their entirety.

FIELD OF INVENTION

The present invention relates to the technical field of semiconductor device and fabricating process, in particular to an insulated gate bipolar transistor (IGBT) and fabrication method therefor.

PRIOR ARTS

IGBT is a composite full-controlled voltage-driven power semiconductor device composed of BJT (bipolar transistor) and MOS (insulated gate field-effect transistor), which has combined the advantages of the high input impedance of MOSFET (Metal-Oxide-Semiconductor Field-Effect Transistor) and the low turn-on voltage drop of GTR (Giant Transistor). The saturation voltage of GTR is low, the current-carrying density is high, but the drive current is large; the drive power of MOSFET is very small, the switching speed is fast, but the turn-on voltage drop is large, and the current-carrying density is small. IGBT combines the advantages of the above two devices, with low driving power and low saturation voltage. It is very suitable to be used in converter systems with a DC voltage of 600V (Volt) and above, such as AC motors, frequency converters, switching power supplies, lighting circuits, traction drives and other fields.

Some IGBTs with specific structures have built-in reverse diodes, and the reverse diode is used as a flyback diode (also known as a "freewheel diode"). FIG. 1 shows a structure of a semiconductor device comprising an insulated gate bipolar transistor with a built-in reverse diode, and the equivalent circuit of the reverse diode D is shown by a dotted line in the FIG. 1. Refer to FIG. 1, the insulated gate bipolar transistor comprises a first p-type heavily doped layer 104 (as a collector), a first n-type heavily doped layer 102, a second n-type heavily doped layer 105, an n-type lightly doped layer 101, a second p-type heavily doped layer 108, a third p-type heavily doped layer 114, a third n-type heavily doped layer 109, a fourth n-type heavily doped layer 112, a fifth n-type heavily doped layer 111, a sixth n-type heavily doped layer 110, a gate oxide layer 106, a gate 107, and an emitter 113. Wherein, the second p-type heavily doped layer 108, the n-type lightly doped layer 101, the second n-type heavily doped layer 105, and the first n-type heavily doped layer 102 constitute the built-in reverse diode D. Wherein, the first n-type heavily doped layer 102 is the n-type heavily doped layer of the reverse diode D, that is, the n+ junction of the reverse diode D.

In the process of fabricating the n+ junction of the reverse diode, ion implantation is required in the substrate to form an n-type heavily doped layer (first n-type heavily doped layer 102). In the prior art, in the process of performing ion implantation into the substrate to form the n+ junction of the reverse diode, phosphorus implantation extension technology is often used. Specifically referring to FIG. 1, from the back surface of the semiconductor substrate, a suitable concentration of phosphorous ions is implanted into the semiconductor substrate along the Dr direction, to form an n-type heavily doped layer in the back surface region of the semiconductor substrate, the n-type heavily doped layer serves as the n+ junction of the reverse diode built in the IGBT. However, the reverse diode obtained by the above method has a slower reverse recovery speed, resulting in poor performance of the IGBT

CONTENT OF THE PRESENT INVENTION

The technical problem to be solved in the present invention is for overcoming the disadvantage that the reverse recovery speed of the reverse diode in the IGBT is slow, hence providing an insulated gate bipolar transistor (IGBT) and fabrication method therefor.

The present invention solves the above-mentioned technical problems through the following technical solutions:

A fabrication method for the insulated gate bipolar transistor comprises the following steps:

Implanting hydrogen ions, or arsenic ions, or nitrogen ions into a substrate from a back surface of the substrate of the insulated gate bipolar transistor, so as to form an n-type heavily doped layer of a reverse diode of the insulated gate bipolar transistor.

Preferably, after the step of implanting hydrogen ions into a substrate from a back surface of the substrate of the insulated gate bipolar transistor, so as to form an n-type heavily doped layer of a reverse diode, the fabrication method for the insulated gate bipolar transistor further comprises the following steps:

Annealing the n-type heavily doped layer of the reverse diode, so as to form a recombination center in the n-type heavily doped layer of the reverse diode.

Preferably, the annealing step adopts furnace tube annealing, the annealing temperature is 200-400 degrees Celsius, and the annealing time is 1-5 hours.

Preferably, the annealing step adopts laser annealing.

Preferably, before the step of implanting hydrogen ions, or arsenic ions, or nitrogen ions into a substrate from a back surface of the substrate of the insulated gate bipolar transistor, so as to form an n-type heavily doped layer of a reverse diode, the fabrication method for the insulated gate bipolar transistor further comprises the following steps:

Disposing a mask on the back surface of the substrate, the mask comprises a blocking region and a transmission region, the blocking region is used to block hydrogen ions, or arsenic ions, or nitrogen ions implanted into the substrate; the transmission region is used to supply hydrogen ions, or arsenic ions, or nitrogen ions pass through, so as to implant the substrate.

Preferably, the mask is made of polyimide (Pl) material.

Preferably, the mask is made of aluminum material.

Preferably, the mask is made of silicon nitride (SiN) material.

Preferably, the thickness of the mask is 2-100 microns.

The present invention further provides an insulated gate bipolar transistor, the insulated gate bipolar transistor is fabricated by the fabrication method for the insulated gate bipolar transistor of the present invention.

The positive improved effects of this invention are: in the fabrication method for the insulated gate bipolar transistor of the present invention, in the step of fabricating the n+ junction of the reverse diode of the IGBT, a hydrogen ion, or arsenic ion, or nitrogen ion implantation process is used to replace the phosphorus ion implantation process in the prior art, and then activated by annealing, so that hydrogen ions form a recombination center in the n-type heavily doped layer, thereby accelerating the reverse recovery speed of the built-in reverse diode, shortening its reverse recovery time, and improving the performance of the IGBT. Correspondingly, the insulated gate bipolar transistor of the present invention is fabricated by the fabrication method for the insulated gate bipolar transistor of the present invention, and the reverse recovery time of the built-in reverse diode is short, and the performance of the IGBT is improved.

DETAILED DESCRIPTION OF THE PREFERRED EMBODIMENT

The present invention will be further illustrated by the following embodiments, but the present invention is not limited thereto.

Figure 1:
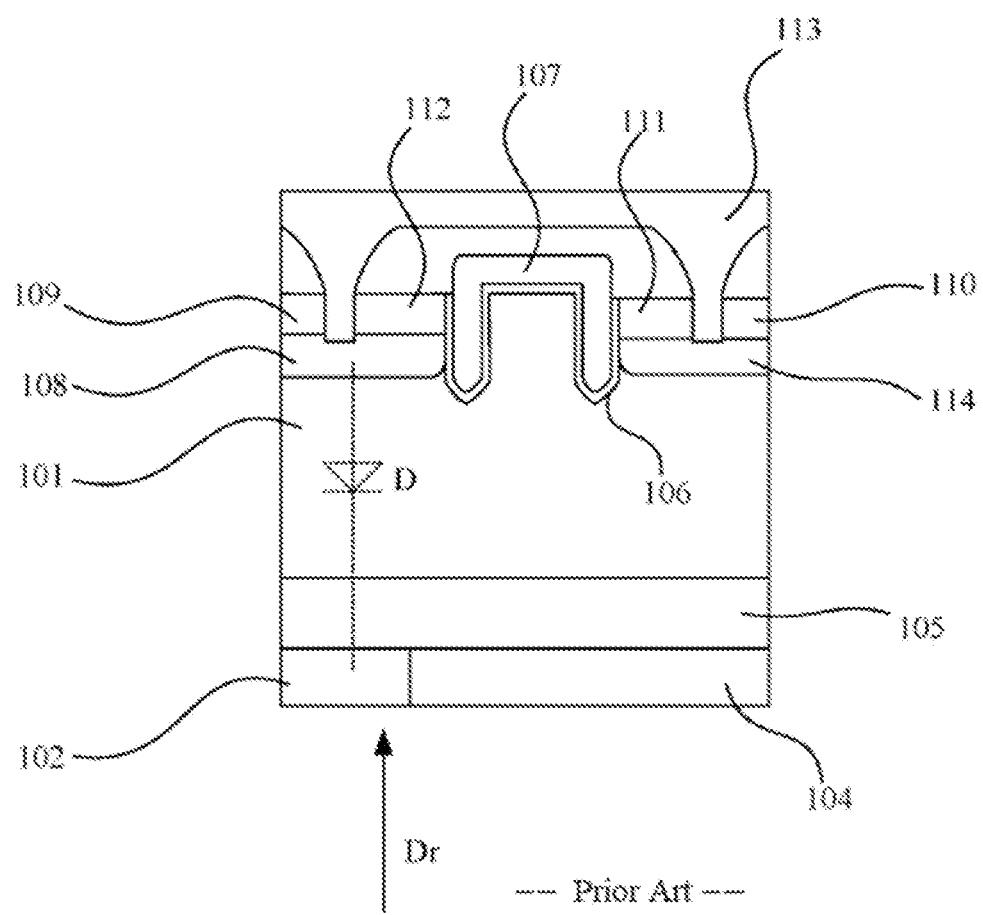
FIG. 1 is a schematic structural diagram of an insulated gate bipolar transistor in the prior art.
Figure 2:
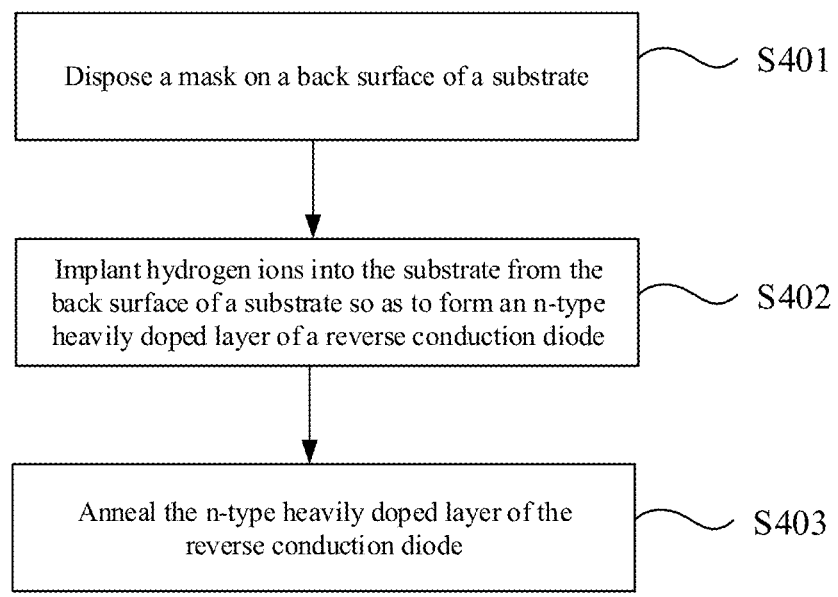
FIG. 2 is a flowchart of a fabrication method for the insulated gate bipolar transistor according to a preferred embodiment of the present invention.

A fabrication method for the insulated gate bipolar transistor of this embodiment, as shown in FIG. 2, comprises the following steps:

Step S402, implanting hydrogen ions into a substrate from a back surface of the substrate, so as to form an n-type heavily doped layer of a reverse diode, the reverse diode is a reverse diode built into an insulated gate bipolar transistor.

In order to activate the hydrogen ions in the n-type heavily doped layer, the fabrication method for the insulated gate bipolar transistor of this embodiment, as shown in FIG. 2, further comprises the following steps:

Step S403, annealing the n-type heavily doped layer of the reverse diode.

After the annealing process, the hydrogen ions in the n-type heavily doped layer can be activated, so as to form a recombination center in the n-type heavily doped layer of the reverse diode.

During the annealing step, part of the structure of the insulated gate bipolar transistor has been fabricated on the front surface of the semiconductor substrate, in order to avoid factors such as high temperature in the annealing step from adversely affecting the fabricated structure, and to obtain better annealing effect, the annealing step adopts laser annealing. In other alternative implementations of the fabrication method for the insulated gate bipolar transistor of the present invention, the annealing step adopts furnace tube annealing, the annealing temperature is preferably 200-400 degrees Celsius, and the annealing time is 1-5 hours.

In order to perform accurate ion implantation and prevent the ions diffusing to other regions, before the step S402, referring to FIG. 2, the fabrication method for the insulated gate bipolar transistor of this embodiment further comprises the following steps:

Step S401, disposing a mask on the back surface of the substrate, the mask comprises a blocking region and a transmission region, the blocking region is used to block hydrogen ions implanted into the substrate; the transmission region is used to supply hydrogen ions pass through, so as to implant the substrate.

The mask is made of polyimide resin material, or aluminum material, or silicon nitride material. The polyimide resin material, or aluminum material, or silicon nitride material is commercially available. According to experimental data, during the hydrogen ions implantation process, the blocking efficiency of a 1-micron-thick aluminum material mask is 1 micron, that is, assuming that the thickness of the aluminum material mask is 5 microns, when hydrogen ions implantation is performed, and when hydrogen ions are implanted into an region 5 microns below the transmission region, there is no hydrogen ion implantation under the blocking region, all are blocked. According to experimental data, the blocking efficiency of a 1-micron-thick polyimide resin mask is 0.7 micron. In the fabrication method for the insulated gate bipolar transistor of this embodiment, the thickness of the polyimide resin mask is 2-100 microns, the thickness of the aluminum material mask is 2-100 microns. In the prior art, a silicon dioxide mask is often used, however, due to tension and stress factors, when the silicon dioxide mask reaches a certain thickness, it is easy to warp, which will affect the reliability of the IGBT. Therefore, the silicon dioxide mask cannot reach a large thickness. However, the polyimide resin mask and aluminum material mask can both reach a larger thickness without warping, which can ensure the reliability of the IGBT.

Figure 3:
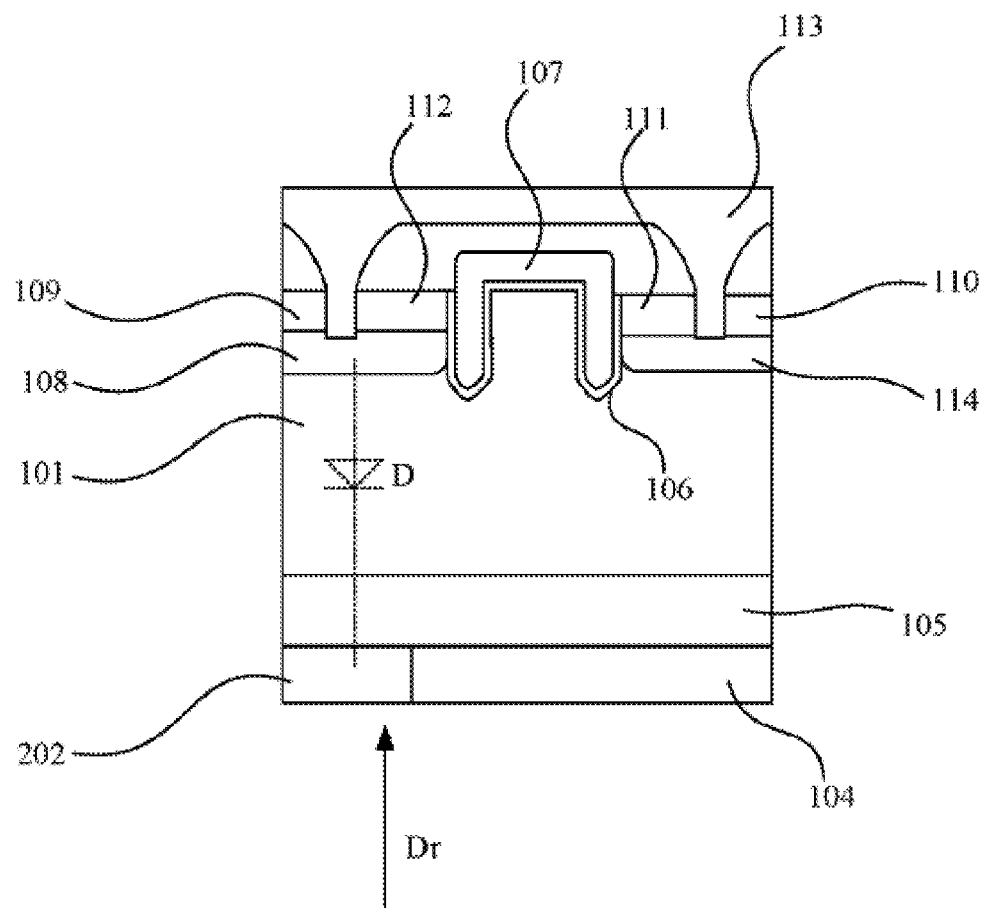
FIG. 3 is a schematic structural diagram of an insulated gate bipolar transistor of a first alternative implementation of a fabrication method for the insulated gate bipolar transistor according to a preferred embodiment of the present invention.

In a first alternative implementation of a fabrication method for the insulated gate bipolar transistor of the present invention, the fabrication method for the insulated gate bipolar transistor can be used to fabricate an insulated gate bipolar transistor as shown in FIG. 3, specifically for fabricating an n+ junction of the reverse diode built into the insulated gate bipolar transistor. FIG. 3 shows a structure of a semiconductor device comprising the insulated gate bipolar transistor with a built-in reverse diode, the dotted line in the figure shows an equivalent circuit of the reverse diode D, the insulated gate bipolar transistor is fabricated by the fabrication method for the insulated gate bipolar transistor of the of this embodiment. Referring to the FIG. 3, the insulated gate bipolar transistor comprises a first p-type heavily doped layer 104 (as a collector), a first n-type heavily doped layer 202, a second n-type heavily doped layer 105, an n-type lightly doped layer 101, a second p-type heavily doped layer 108, a third p-type heavily doped layer 114, a third n-type heavily doped layer 109, a fourth n-type heavily doped layer 112, a fifth n-type heavily doped layer 111, a sixth n-type heavily doped layer 110, a gate oxide layer 106, a gate 107, and an emitter 113. Wherein, the second p-type heavily doped layer 108, the n-type lightly doped layer 101, the second n-type heavily doped layer 105, and the first n-type heavily doped layer 202 constitute the built-in reverse diode D. Wherein, the first n-type heavily doped layer 202 is the n-type heavily doped layer of the reverse diode D, and the n-type heavily doped layer serves as the n+ junction of the reverse diode built in the insulated gate bipolar transistor.

Figure 4:
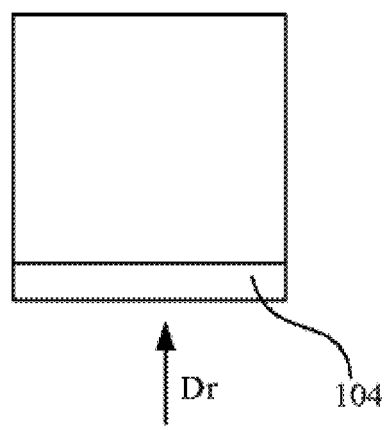
FIG. 4 is a schematic state diagram of an insulated gate bipolar transistor with a first p-type heavily doped layer which is fabricated in a fabrication method for the insulated gate bipolar transistor according to a preferred embodiment of the present invention.
Figure 5:
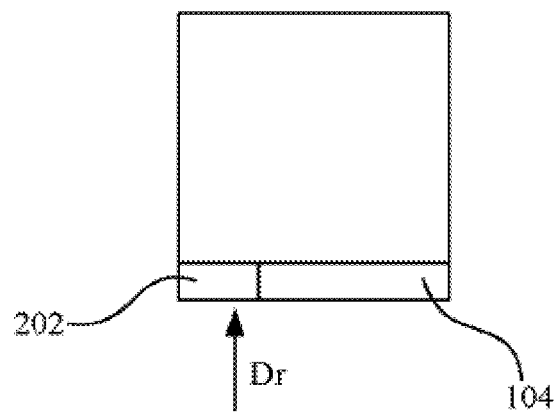
FIG. 5 is a schematic state diagram of an insulated gate bipolar transistor with a first n-type heavily doped layer which is fabricated in a fabrication method for the insulated gate bipolar transistor according to a preferred embodiment of the present invention.

In the process of fabricating the insulated gate bipolar transistor, in order to form the n+ junction of the reverse diode D, firstly, referring to FIG. 4 (other structures that have been fabricated on the semiconductor substrate are not shown), implanting ions into the substrate from a back surface of the substrate along the Dr direction, to form a first p-type heavily doped layer 104, and an annealing operation is performed on the first p-type heavily doped layer 104. Then, referring to FIG. 5 (other structures that have been fabricated on the semiconductor substrate are not shown), a proper concentration of hydrogen ions is implanted into the first p-type heavily doped layer 104 along the Dr direction on the back surface of the semiconductor substrate, to form an n-type heavily doped layer, namely the first n-type heavily doped layer 202, the n-type heavily doped layer serves as the n+ junction of the reverse diode built in the insulated gate bipolar transistor. Then, an annealing operation is performed on the first n-type heavily doped layer 202, so as to activate the hydrogen ions in the first n-type heavily doped layer 202, thereby forming a recombination center. The other structures of the insulated gate bipolar transistor shown in FIG. 3 are all fabricated using fabricating processes in the prior art.

In other alternative implementations of the fabrication method for the insulated gate bipolar transistor of the present invention, in the step of fabricating the first n-type heavily doped layer, arsenic ions or nitrogen ions can be implanted into the semiconductor substrate from a back surface of the semiconductor substrate along the Dr direction, to form a first n-type heavily doped layer.

FIG. 3 shows a typical structure of an insulated gate bipolar transistor comprising a built-in reverse diode, those skilled in the art can understand that there are many different structures of insulated gate bipolar transistors comprising a built-in reverse diode. The fabrication method for the insulated gate bipolar transistor of the present invention can be applied to the manufacture of various insulated gate bipolar transistors comprising built-in reverse diodes. In the fabrication method for the insulated gate bipolar transistor of the present invention, in the process of fabricating the n+ junction of the reverse diode, hydrogen ion (or arsenic ion, or nitrogen ion) implantation process is used to replace the prior art phosphorous ion implantation process, while forming the n+ junction of the reverse diode, a recombination center is formed in the n+ junction of the reverse diode, thereby accelerating the reverse recovery speed of the built-in reverse diode, shortening its reverse recovery time, and improving the performance of the insulated gate bipolar transistor.

This embodiment further provides an insulated gate bipolar transistor whose structure is shown in FIG. 3, comprising a first p-type heavily doped layer 104 (as a collector), a first n-type heavily doped layer 202, a second n-type heavily doped layer 105, an n-type lightly doped layer 101, a second p-type heavily doped layer 108, a third p-type heavily doped layer 114, a third n-type heavily doped layer 109, a fourth n-type heavily doped layer 112, a fifth n-type heavily doped layer 111, a sixth n-type heavily doped layer 110, a gate oxide layer 106, a gate 107, and an emitter 113. Wherein, the second p-type heavily doped layer 108, the n-type lightly doped layer 101, the second n-type heavily doped layer 105, and the first n-type heavily doped layer 202 constitute a built-in reverse diode D. Wherein, the first n-type heavily doped layer 202 is the n-type heavily doped layer of the reverse diode D, and the n-type heavily doped layer serves as the n+ junction of the reverse diode built in the insulated gate bipolar transistor. Insulated gate bipolar transistor. The insulated gate bipolar transistor is fabricated by the fabrication method for the insulated gate bipolar transistor of this embodiment, and the specific process will not be repeated the description. Because in the step of fabricating the n+ junction of the reverse diode of the insulated gate bipolar transistor, a hydrogen ion implantation process is used to replace the phosphorous ion implantation process in the prior art, and then it is activated by annealing, so that hydrogen ions form a recombination center in the n-type heavily doped layer, it can accelerate the reverse recovery speed of the built-in reverse diode, and shorten the reverse recovery time, therefore, the insulated gate bipolar transistor has better performance.

Figure 6:
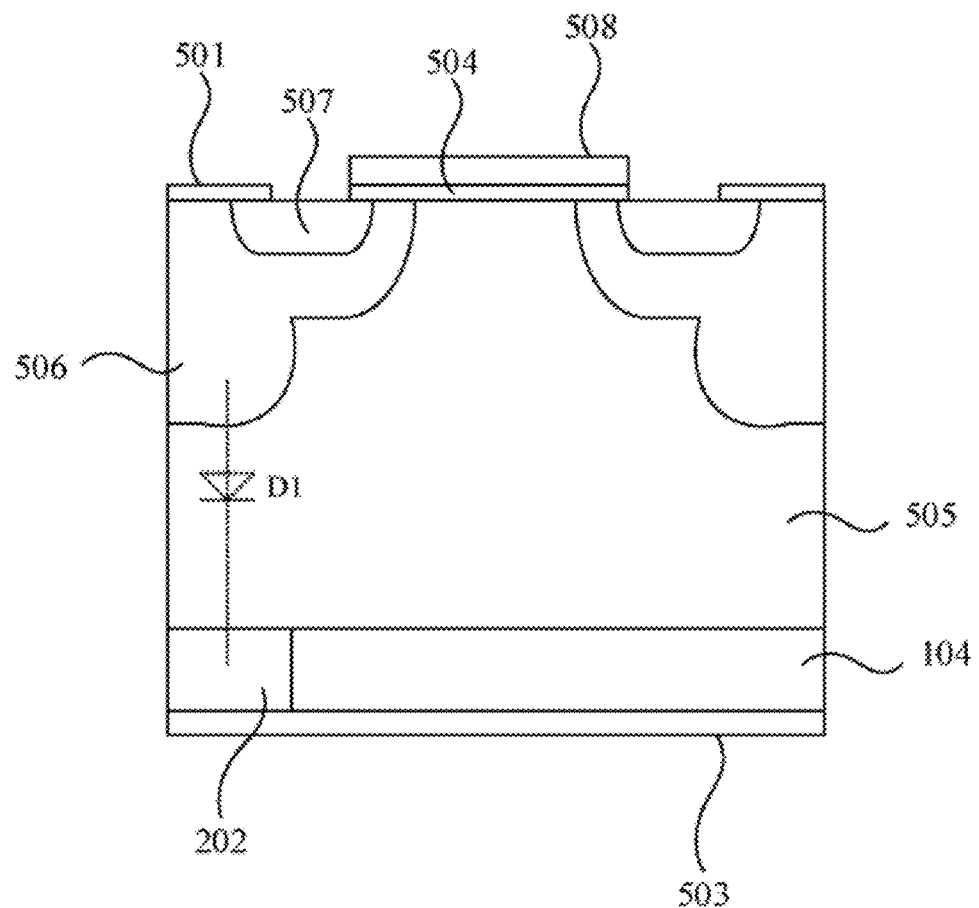
FIG. 6 is a schematic structural diagram of an insulated gate bipolar transistor of a second alternative implementation of a fabrication method for the insulated gate bipolar transistor according to a preferred embodiment of the present invention.

In a second alternative implementation of a fabrication method for the insulated gate bipolar transistor of the present invention, the fabrication method for the insulated gate bipolar transistor also can be used to fabricate an insulated gate bipolar transistor as shown in FIG. 6, specifically for fabricating an n+ junction of the reverse diode built into the insulated gate bipolar transistor. The insulated gate bipolar transistor comprises a collector 503 (the collector 503 is a metal anode), a first p-type heavily doped layer 104, a first n-type heavily doped layer 202, an n-type drift region (drift region) 505, a p-well 506, a second n-type heavily doped layer 507, an emitter 501 (the emitter 501 is a metal cathode), a gate oxide layer 504, and a gate 508. The p-well 506, the n-type drift region 505, and the first n-type heavily doped layer 202 form a reverse diode D1, the equivalent circuit of the reverse diode D1 is shown by a dotted line in FIG. 6, wherein the first n type heavily doped layer 202 is the n type heavily doped layer of the reverse diode D1, the n type heavily doped layer serves as the n+ junction of the reverse diode built in the insulated gate bipolar transistor.

In the process of fabricating the insulated gate bipolar transistor, in order to form the n+ junction of the reverse diode D1, firstly, referring to FIG. 4 (other structures that have been fabricated on the semiconductor substrate are not shown), implanting ions into the semiconductor substrate from a back surface of the semiconductor substrate along the Dr direction, to form a first p-type heavily doped layer 104, and an annealing operation is performed on the first p-type heavily doped layer 104. Then, referring to FIG. 5 (other structures that have been fabricated on the semiconductor substrate are not shown), a proper concentration of hydrogen ions is implanted into the first p-type heavily doped layer 104 along the Dr direction on the back surface of the semiconductor substrate, to form an n-type heavily doped layer, namely the first n-type heavily doped layer 202, the n-type heavily doped layer serves as the n+ junction of the reverse diode built in the insulated gate bipolar transistor. Then, an annealing operation is performed on the first n-type heavily doped layer 202, so as to activate the hydrogen ions in the first n-type heavily doped layer 202, thereby forming a recombination center. The other structures of the insulated gate bipolar transistor shown in FIG. 6 are all fabricated using fabricating processes in the prior art.

Although the specific embodiments of the present invention are described above, it should be understood by those skilled in the art that this is only an example, and the scope of protection of the present invention is defined by the appended claims. Those skilled in the art can make various changes or modifications to these embodiments without departing from the principles and essence of the present invention. Therefore, the protection scope of the present invention is defined by the appended claims.

What is claimed is:

1. A method of fabricating an insulated gate bipolar transistor, the method comprising:
   implanting hydrogen ions into a substrate of the insulated gate bipolar transistor, from a back surface of the substrate, to form an n-type heavily doped layer of a reverse diode of the insulated gate bipolar transistor; and
   annealing the n-type heavily doped layer of the reverse diode to form a recombination center,
   wherein the n-type heavily doped layer and the recombination center are formed together by implanting the hydrogen ions into the back surface of the substrate only in one stage, to control a lifetime of the reverse diode of the insulated gate bipolar transistor to shorten a reverse recovery time of the reverse diode.

2. The method of fabricating the insulated gate bipolar transistor according to claim 1, wherein
   the annealing includes annealing the n-type heavily doped layer of the reverse diode to form the recombination center in the n-type heavily doped layer of the reverse diode after implanting the hydrogen ions into the substrate.

3. The method of fabricating the insulated gate bipolar transistor according to claim 2, wherein the annealing includes furnace tube annealing, an annealing temperature is in a range of 200-400 degrees Celsius, and an annealing time is in a range of 1-5 hours.

4. The method of fabricating the insulated gate bipolar transistor according to claim 1, wherein before the implanting the hydrogen ions into the substrate from a back surface of the substrate to form the n-type heavily doped layer of the reverse diode, the method further comprises:
   disposing a mask on the back surface of the substrate, wherein the mask comprises a blocking region and a transmission region, the blocking region is arranged to block hydrogen ions from being implanted into the substrate, and the transmission region is arranged to allow hydrogen ions to pass through to implant the substrate.

5. The method of fabricating the insulated gate bipolar transistor according to claim 4, wherein the mask comprises polyimide material.

6. The method of fabricating the insulated gate bipolar transistor according to claim 4, wherein the mask comprises aluminum material.

7. The method of fabricating the insulated gate bipolar transistor according to claim 4, wherein the mask comprises silicon nitride material.

8. The method of fabricating the insulated gate bipolar transistor according to claim 5, wherein a thickness of the mask is in a range of 2-100 microns.

9. The method of fabricating the insulated gate bipolar transistor according to claim 2, wherein the annealing includes laser annealing.

10. An insulated gate bipolar transistor fabricated by the method according to claim 1.

11. The method of fabricating the insulated gate bipolar transistor according to claim 6, wherein a thickness of the mask is in a range of 2-100 microns.

12. The method of fabricating the insulated gate bipolar transistor according to claim 7, wherein a thickness of the mask is in a range of 2-100 microns.

13. The insulated gate bipolar transistor according to claim 10, wherein:
   the annealing includes annealing the n-type heavily doped layer of the reverse diode to form the recombination center in the n-type heavily doped layer of the reverse diode after implanting the hydrogen ions into the substrate.

14. The insulated gate bipolar transistor according to claim 13, wherein the annealing includes furnace tube annealing, an annealing temperature is in a range of 200-400 degrees Celsius, and an annealing time is in a range of 1-5 hours.

15. The insulated gate bipolar transistor according to claim 10, wherein before the implanting the hydrogen ions into the substrate from a back surface of the substrate to form the n-type heavily doped layer of the reverse diode, the method of fabricating the insulated gate bipolar transistor further comprises:
   disposing a mask on the back surface of the substrate, wherein the mask comprises a blocking region and a transmission region, the blocking region is arranged to block hydrogen ions from being implanted into the substrate, and the transmission region is arranged to allow hydrogen ions to pass through to implant the substrate.

16. The insulated gate bipolar transistor according to claim 15, wherein the mask comprises at least one of polyimide material, aluminum material, and silicon nitride material.

17. The insulated gate bipolar transistor according to claim 16, wherein a thickness of the mask is in a range of 2-100 microns.

18. The insulated gate bipolar transistor according to claim 13, wherein the annealing includes laser annealing.

* * * * *